(12) United States Patent
Chen et al.

(10) Patent No.: US 10,756,296 B2
(45) Date of Patent: Aug. 25, 2020

(54) PACKAGING STRUCTURE

(71) Applicant: Kunshan Go-Visionox Opto-Electronics Co., Ltd., Kunshan (CN)

(72) Inventors: Zhaoli Chen, Kunshan (CN); Jinfang Zhang, Kunshan (CN); Lu Zhang, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/293,426

(22) Filed: Mar. 5, 2019

(65) Prior Publication Data

US 2019/0207143 A1    Jul. 4, 2019

Related U.S. Application Data

(63) Continuation-in-part of application No. PCT/CN2018/107599, filed on Sep. 26, 2018.

(30) Foreign Application Priority Data

Jan. 19, 2018 (CN) .................... 2018 2 0093096 U

(51) Int. Cl.
*H01L 51/52* (2006.01)
*H01L 51/00* (2006.01)
(Continued)

(52) U.S. Cl.
CPC ........ *H01L 51/524* (2013.01); *H01L 27/3276* (2013.01); *H01L 51/0096* (2013.01); *H01L 51/56* (2013.01)

(58) Field of Classification Search
CPC .............. H01L 51/524; H01L 27/3276; H01L 51/0096; H01L 51/56; H01L 51/52; H01L 27/32

See application file for complete search history.

(56) References Cited

U.S. PATENT DOCUMENTS

2003/0218238 A1* 11/2003 Kikuchi ................. H01L 23/66
257/678
2005/0258771 A1* 11/2005 Kang .................... G09G 3/3225
315/169.1

(Continued)

FOREIGN PATENT DOCUMENTS

| CN | 103682147 A | 3/2014 |
| CN | 104183686 A | 12/2014 |

(Continued)

OTHER PUBLICATIONS

PCT International Search Report dated Jan. 4, 2019 in International Application No. PCT/CN2018/107599, Includes English Translation. 7 pages.

*Primary Examiner* — Ahmed N Sefer

(57) ABSTRACT

The present application discloses a packaging structure, the packaging structure includes a first substrate, a side of the first substrate including a power supply terminal; a second substrate; a metal extension layer, extending from the power supply terminal to both ends of the first side of the first substrate; and a packaging layer, covering the metal extension layer and fastening the first substrate and the second substrate.

14 Claims, 3 Drawing Sheets

(51) Int. Cl.
*H01L 27/32* (2006.01)
*H01L 51/56* (2006.01)

(56) References Cited

U.S. PATENT DOCUMENTS

| | | | | |
|---|---|---|---|---|
| 2006/0170342 | A1* | 8/2006 | Kim | H01L 27/3276 313/512 |
| 2007/0146624 | A1* | 6/2007 | Duston | G02B 3/08 349/193 |
| 2007/0152922 | A1* | 7/2007 | Jung | H01L 27/3276 345/76 |
| 2008/0054796 | A1* | 3/2008 | Sung | H01L 27/3276 313/504 |
| 2012/0293064 | A1 | 11/2012 | Hong | |
| 2014/0070192 | A1* | 3/2014 | Sung | H01L 51/5253 257/40 |
| 2015/0123097 | A1* | 5/2015 | Iijima | H01L 27/3288 257/40 |
| 2018/0151820 | A1* | 5/2018 | Saiki | F21S 2/00 |
| 2018/0188432 | A1* | 7/2018 | Choi | H01L 27/3276 |
| 2018/0337226 | A1* | 11/2018 | Liu | H01L 27/3276 |

FOREIGN PATENT DOCUMENTS

| | | | |
|---|---|---|---|
| CN | 104882566 A | | 9/2015 |
| CN | 106816546 A | | 6/2017 |
| CN | 104157792 A | | 11/2017 |
| JP | 2004-61707 | * | 2/2004 |
| KR | 2008-69032 | * | 7/2008 |

\* cited by examiner

PACKAGING STRUCTURE

CROSS-REFERENCE TO ASSOCIATED APPLICATIONS

This application is a Continuation-In-Part application of PCT Application No. PCT/CN2018/107599, filed on Sep. 26, 2018 which claims priority to CN Patent Application No. 201820093096.4, filed on Jan. 19, 2018. All of the aforementioned applications are hereby incorporated by reference in their entireties.

TECHNICAL FIELD

Embodiments of the present application relate to the technical field of display technologies, in particular to a packaging structure.

BACKGROUND

Flat display devices have many advantages such as thin body, power saving, no radiation and so on, and thus are widely used. The prior flat display device mainly includes a liquid crystal display (LCD) and an organic light-emitting diode (OLED) display device.

A packaging process, such as a frit packaging, is one of processes for preparing the OLED display device. However, in the packaging process, when a temperature gradient and a stress intensity are unevenly distributed as well as that the temperature gradient and the stress intensity do not match a thermal expansion coefficient of material, due to the influence of thermal energy in a laser sealing process, cracks are easily generated on a film under the frit, which may result in breakage of signal lines and thereby causing an abnormal display.

SUMMARY

Embodiments of the present application are aimed at providing a packaging structure to improve breakage of signal lines.

To solve the above technical problem, the present application provides a packaging structure, including: a first substrate, a first side of the first substrate including a power supply terminal; a second substrate; a metal extension layer extending from the power supply terminal to both ends of the first side of the first substrate; and a packaging layer disposed between the first substrate and the second substrate, covering the metal extension layer and fastening the first substrate and the second substrate.

Optionally, the second substrate is a packaging cover.

Optionally, for the packaging structure, the metal extension layer includes a plurality of via holes for stress relief.

Optionally, for the packaging structure, the via holes are spaced evenly.

Optionally, the power supply terminal includes a plurality of via holes.

Optionally, each of the via holes is in a shape of square.

Optionally, for the packaging structure, a width of the metal extension layer is same to a width of the packaging layer.

Optionally, for the packaging structure, a width of the metal extension layer is ¼ to ⅓ of a width of the packaging layer.

Optionally, the metal extension layer is disposed in the middle of the packaging layer.

Optionally, for the packaging structure, the power supply terminal includes a working voltage terminal and a common ground terminal.

Optionally, for the packaging structure, the metal extension layer includes a first metal extension layer extending from the working voltage terminal to both ends of the side and a second metal extension layer extending from the common ground terminal to both ends of the side, and a portion of the first metal extension layer is not in contact with a portion of the second metal extension layer when the portion of the first metal extension layer and the portion of the second metal extension layer extend face to face respectively from the working voltage terminal and the common ground terminal.

Optionally, for the packaging structure, a shape of the first substrate is a polygon and the power supply terminal is disposed at a first side of the polygon.

Optionally, for the packaging structure, a first metal layer is disposed on a second side of the polygon, and the packaging layer is disposed on the first metal layer.

Optionally, for the packaging structure, the first metal layer includes a plurality of via holes.

Optionally, for the packaging structure, a shape of the metal extension layer is a polyline.

As another aspect of the present application, the present application also provides an OLED display device including the packaging structure as described above.

The packaging structure provided by the present application includes: a first substrate, a first side of the first substrate including a power supply terminal; a second substrate; a metal extension layer extending from the power supply terminal to both ends of the first side of the first substrate; and a packaging layer disposed between the first substrate and the second substrate, covering the metal extension layer and fastening the first substrate and the second substrate. Thereby, the packaging structure provided by the present application effectively utilizes an extension filling of a metal can contribute to conducting thermal energy and improving the breakage of the signal lines.

Further, because of the width of the metal extension layer being same to the width of the packaging layer, uniformity of a thickness of a film can be improved.

Further, because of via holes of the metal extension layer, stress can be effectively eliminated and a risk of the breakage of the signal line can be reduced.

Further, because of the metal extension layer disposed in the middle of the packaging layer, a crack initiation point of stress concentration can be eliminated and the risk of the breakage of the signal line can be reduced.

DETAILED DESCRIPTION

In order to make the purposes, technical means and advantages of the present application more clear, the present application will be further described in detail below with reference to the accompanying drawings. Obviously, the described embodiments are only a part of the embodiments of the present application, and not all of the embodiments of the present application.

The packaging structure of the present application will be described in more detail below with reference to the accompanying drawings, which illustrates a preferred embodiment of the present application, and it should be understood that those skilled in the art may modify the present application described herein and the advantageous effects of the present application can still be achieved. Therefore, the following description is not intended to limit the present application.

The present application is described more specifically by a way of an example in the following paragraphs with reference to the accompanying drawings. According to the following instructions and claims, the advantages and characteristics of the present application will be clearer. It should be noted that the accompanying drawings are in a very simplified form and all of the accompanying drawings use inaccurate proportions only to assist conveniently and clearly illustrating the purpose of the embodiments of the present application.

In the following description, it should be understood that when a layer (or a film) or a region or a pattern or a structure is disposed on a substrate (or a layer) or a film or a region or a pad or a pattern, the layer (or the film) or the region or the pattern or the structure may be directly disposed on a surface of the substrate (or the layer) or the film or the region or the pad or the pattern, and/or another layer may also be disposed therebetween. In addition, it should be understood that when a layer is disposed under another layer, the layer may be directly under a surface of another layer, and/or a third layer may also be disposed therebetween. In addition, whether a layer is disposed on or under another layer can be illustrated by accompanying drawings.

Figure 1:
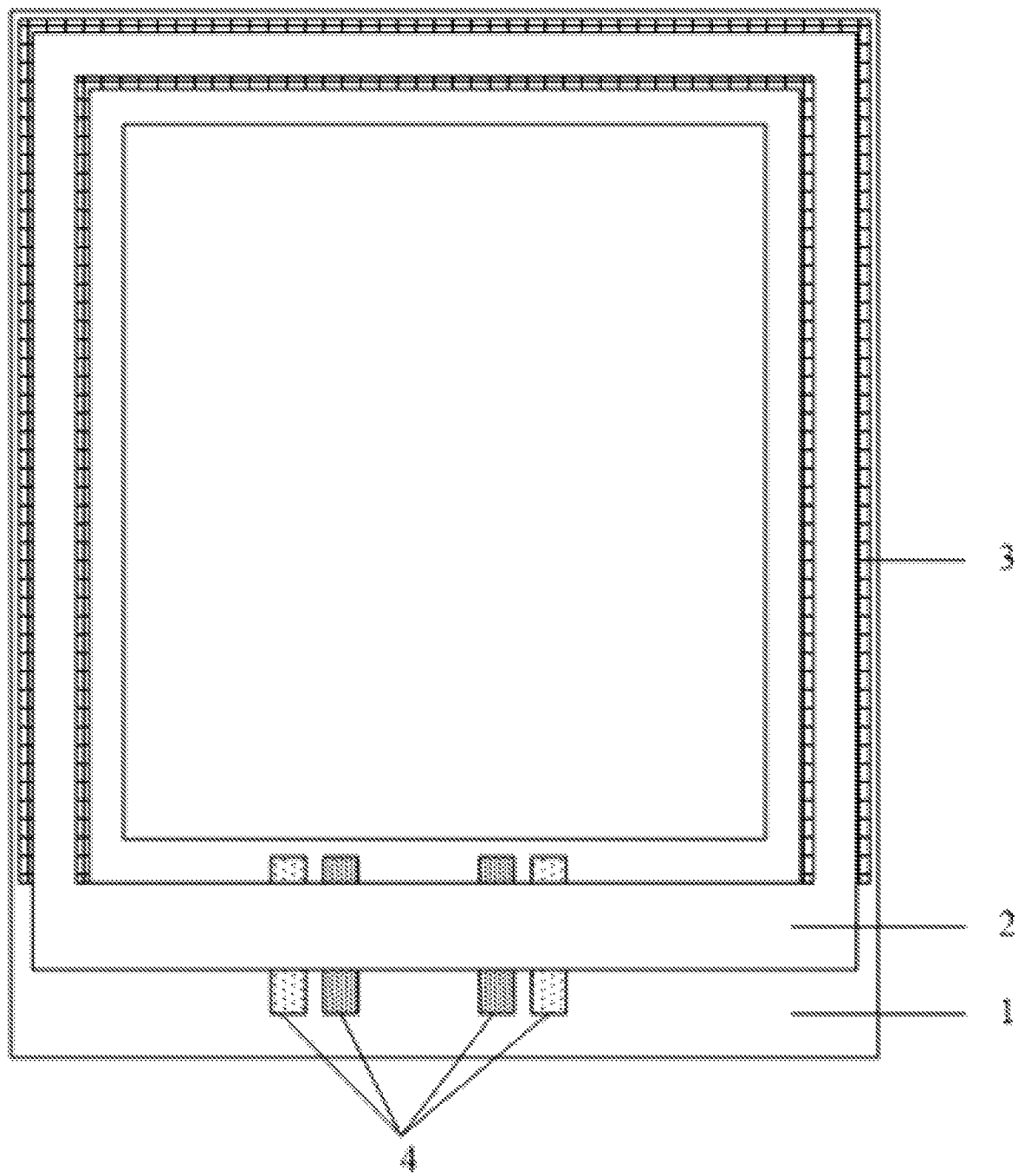
FIG. 1 shows a schematic diagram of a packaging structure.

Referring to FIG. 1, the inventor has studied the packaging structure including a substrate 1, a shape of which is a polygon (e.g., a rectangle); a power supply terminal 4 is disposed on a first side of the substrate 1, and a metal layer 3 is disposed on a second side of the substrate 1. A packaging layer 2 (e.g., frit) is disposed around the substrate 1 (e.g., in a circular pattern) and the packaging layer 2 is disposed on the metal layer 3 and the power supply terminal 4, and then another substrate (not shown in the FIG. 1) is packaged together with the substrate 1 by the packaging layer 2.

However, there are some film layers disposed in the substrate 1 in general, such as signal lines etc. As described above, due to the high temperature and other factors during the packaging process, cracks are generated on the film layer under the packaging layer 2 (e.g., frit), which may result in breakage of the signal lines, thereby may cause an abnormal display. By further studying, the inventor found that the cracks are mainly generated at the packaging layer 2 (e.g., frit) and further extending to affect other film layers.

Thus, the present application proposes a packaging structure, and the packaging structure includes:
a first substrate, a first side of the first substrate including a power supply terminal;
a second substrate;
a metal extension layer, extending from the power supply terminal to both ends of the first side of the first substrate; and,
a packaging layer, disposed between the first substrate and the second substrate, covering the metal extension layer, and fastening the first substrate and the second substrate.

In order to clearly describe the technical scheme of the present application, preferred embodiments of a packaging structure of a touch screen and a method thereof are provided as follows application. It should be clear that the content of the present application is not limited to the following embodiments, and other improvements made through conventional techniques of those skilled in the art are also within the scope of the present application.

As shown in FIG. 2 to FIG. 5, the packaging structure of the embodiment of the present application includes:
a first substrate 10, wherein, a side of the first substrate 10 including power supply terminals 41,42;
a second substrate 60;
metal extension layers 411, 421 extending from the power supply terminals 41, 42 to both ends of the first side of the first substrate (e.g. a direction of A-A'); and,
a packaging layer 20 covering the metal extension layers 411, 421 and fastening the first substrate 10 and the second substrate 60.

Figure 2:
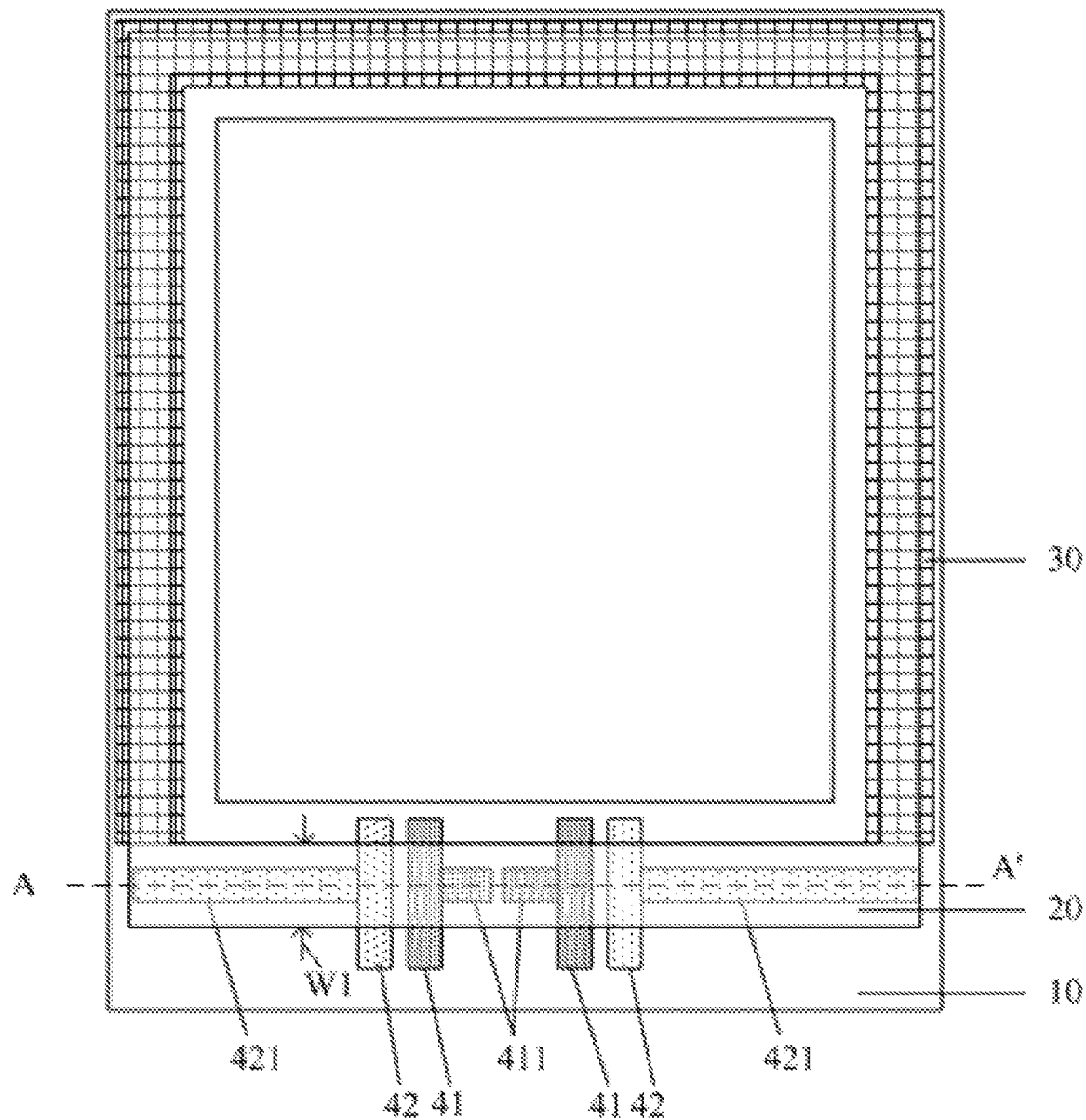
FIG. 2 shows a schematic diagram of a packaging structure according to an embodiment of the present application.
Figure 3:
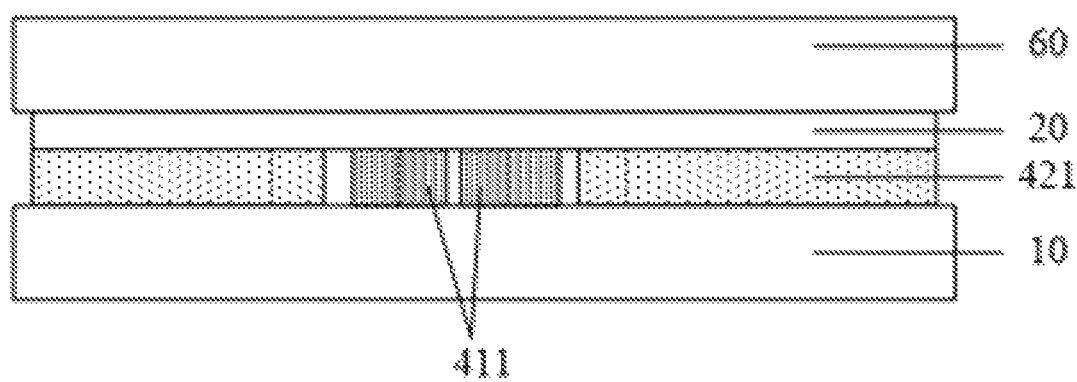
FIG. 3 shows a cross-sectional schematic diagram at A-A' in FIG. 2.

For presentation purposes, the second substrate 60 is not shown in FIG. 2.

The first substrate 10 may be, for example, a display substrate. A display structure, for example, an OLED structure etc., is formed on the first substrate 10. The present application does not particularly limit a structure of the display formed on the first substrate. The structure of the display formed on the first substrate may be designed according to actual needs. For example, a conventional driving circuit may also be formed on the first substrate 10. A drain electrode of a driving transistor of the driving circuit is electrically connected to a bottom electrode of the OLED by a via hole. The specific structure and the forming method of the driving circuit are well known in prior art and will not be described in detail herein. A passivation layer may also be formed on the first substrate 10, used for protecting the driving circuit formed on the first substrate. The passivation layer is preferably made of inorganic material, such as silicon nitride, silicon oxide, aluminum oxide, etc. However it should be understood that the inorganic material (such as silicon nitride, silicon oxide, aluminum oxide, etc.) is only an example of the material of the passivation layer, but the selection range of the material of the passivation layer in the present application is not limited to the above examples, and the material of the passivation layer may be selected in the existing published or commercial materials.

A surrounding region of the display structure may be a driving region, used for applying a voltage to the display structure for example. For example, the first metal layer 30 shown in FIG. 2 is formed in the driving region.

In an embodiment of the present application, a shape of the first substrate 10 is a polygon, and the power supply terminal is disposed on a first side of the polygon, for example a shape of the first substrate 10 is a rectangle and the power supply terminal is disposed on a side of the rectangle.

In a further embodiment, a first metal layer 30 is disposed on a second side of the polygon, and the packaging layer 20 is disposed on the first metal layer 30.

In a further embodiment, the first metal layer 30 includes a plurality of via holes. The via holes can effectively eliminate stress and reduce the risk of the breakage of signal lines.

In an embodiment, the second substrate 60 may be a packaging substrate for example.

In an embodiment of the present application, the power supply terminals 41, 42 are not limited to one terminal, and may include a working voltage (VDD) terminal and a common ground (VSS) terminal for example. As shown in FIG. 2, the power supply terminals 41, 42 includes two working voltage terminals 41 and two common ground terminals 42, the two working voltage terminals 41 are disposed in the middle of a side of the first substrate 10, and the two common ground terminals 42 are respectively disposed on both sides of the two working voltage terminals 41.

It should be understood that the working voltage terminal 41 and the common ground terminal 42 are inconvenient to contact with each other. Therefore, the metal extension layers 411, 421 extending from the working voltage terminal 41 and the common ground terminal 42 are inconvenient to contact with each other too. That is, a first metal extension layer 411 and a second metal extension layer 421 extend respectively from the working voltage terminal (VDD) 41 and the common ground terminal (VSS) 42 to both ends of the side, and a portion of the first metal extension layer 411 is not in contact with a portion of the second metal 421 extension layer when the portion of the first metal extension layer 411 and the portion of the second metal extension layer 421 extend face to face respectively from the working voltage terminal and the common ground terminal.

As shown in FIG. 2, the portion of the first metal extension layer 411 and the portion of the second metal extension layer 421 may be positively opposite each other, or may be staggered of course. When the portion of the first metal extension layer 411 and the portion of the second metal extension layer 421 are staggered, the portion of the metal first extension layer 411 and the portion of the second metal extension layer 421 may have a common overlapping part, and of course, it is better to make the portion of the first metal extension layer 411 and the portion of the second metal extension layer 421 not contacting with each other.

In a further embodiment, the first metal extension layer 411 and the second metal extension layer 421 may be made of one of lithium, magnesium, strontium, aluminum, indium, copper, gold and silver, or may be made of an alloy containing two or more of lithium, magnesium, strontium, aluminum, indium, copper, gold and silver.

In a further embodiment, as shown in FIG. 2, the first metal extension layer 411 extends from the working voltage terminal (VDD) 41 to both ends of the side and the second metal extension layer 421 extends from the common ground terminal (VSS) 42 to both ends of the side, Specifically, for example a shape of the first substrate 10 is a rectangular. The power supply terminals 41, 42 are disposed on a side of the first substrate 10, the first metal extension layer 411 and the second metal extension layer 421 extend respectively from the working voltage terminal (VDD) 41 and the common ground terminal (VSS) 42 towards opposite sides on both ends of the side provided with the power supply terminals 41, 42, just to the location of the packaging layer 20.

Thus, when the packaging layer 20 is heated for packaging, a heat quantity generated during the packaging may be better transferred by the first metal extension layer 411 and the second metal extension layer 421, which contribute to conducting thermal energy, preventing local temperature difference from being too large, and improving the breakage of the signal line.

In an embodiment of the present application, the metal extension layers (for example the first metal extension layer 411 and/or the second metal extension layer 421) includes a plurality of via holes 50.

Figure 4:
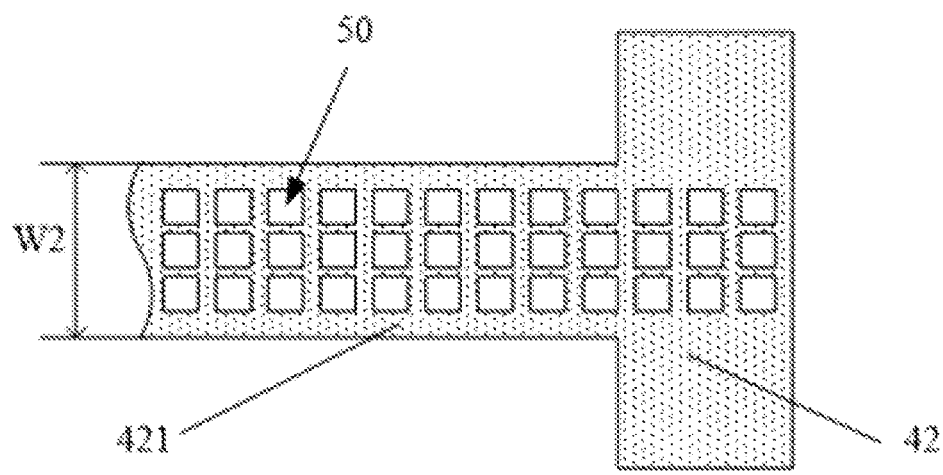
FIG. 4 shows a schematic diagram of a metal extension layer according to an embodiment of the present application.

Referring to FIG. 4, a part of the second metal extension layer 421 is taken as an example. The second metal extension layer 421 extends from the power supply terminal 42 (specifically the common ground terminal). The second metal extension layer 421 may include the via holes 50, and the power supply terminal 42 may include a plurality of the via holes 50 too. An arrangement of the via holes 50 in the power supply terminal 42 may be the same as an arrangement of the via holes 50 in the second metal extension layer 421, and the via holes 50 may be spaced in the whole the power supply terminal 42.

In a further embodiment, the via holes 50 may be evenly spaced or unevenly spaced. For example, a number of the via holes 50 is relatively large at a position where the breakage is more likely to occur, and there is no via holes or fewer via holes at a position where the breakage is less likely to occur.

In a further embodiment, the via holes 50 are square holes for example, and have a size (e.g., a side length) of between 50 μm and 100 μm.

In the embodiment of the present application, because of the via holes 50 disposed on the metal extension layers (for example the first metal extension layer 411 and/or the second metal extension layer 421), the stress may be effectively eliminated and the risk of the breakage of the signal line may be reduced by the via holes 50.

In an embodiment of the present application, a width W2 of the metal extension layer (for example the second extension layer 421) is same to a width W1 of the packaging layer 20, so that the temperature difference can be effectively reduced, and the thickness uniformity of the film can be improved.

Figure 5:
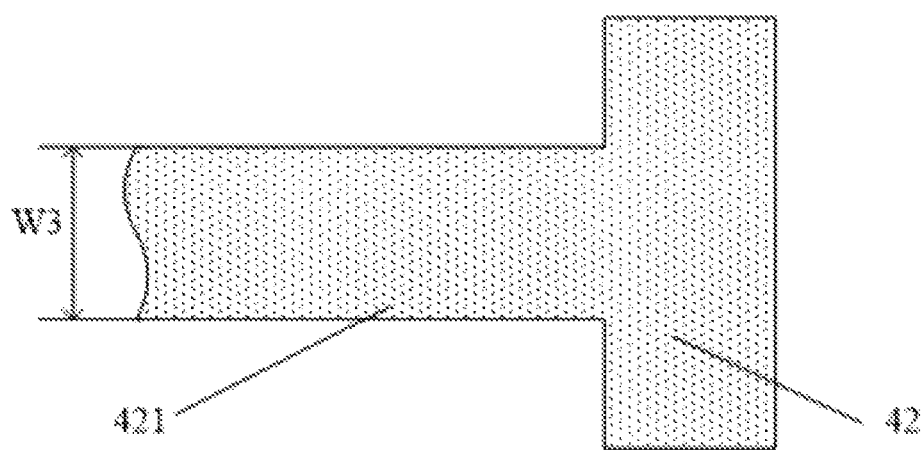
FIG. 5 shows a schematic diagram of a metal extension layer according to another embodiment of the present application.

In another embodiment, the metal extension layers (for example the first metal extension layer 411 and/or the second metal extension layer 421) may not include the via holes 50. As shown in FIG. 5, taking the second metal extension layer 421 for an example, a shape of the second metal extension layer 421 may be a solid strip. In consideration of stress problems caused by the structure of the second metal extension layer 421 without via holes, the width of the second metal extension layer 421 may be appropriately reduced. For example, the width W3 of the second metal extension layer 421 may be ¼ to ⅓ of the width W1 of the packaging layer 20. Further, since the crack usually extends from the middle position of the packaging layer 20, the middle position of the packaging layer 20 may be regarded as a stress concentration portion. Therefore, the second metal extension layer 421 may be disposed in the middle position of the packaging layer 20, so that the stress can be well dispersed.

It should be understood that the shape and the width of the second metal extension layer 421 are not limited to the above, and the shape of the second metal extension layer 421 may be a polyline etc. for example, and the shape and the width of the second metal extension layer 421 may be adjusted as needed by those skilled in the art.

Obviously, the first metal extension layer 411 may be substantially identical to the second metal extension layer 421, and extension directions and extension lengths of the first metal extension layer 411 and the second metal extension layer 421 may be different.

The packaging layer 20 is configured to fix (e.g., by a method of bonding) the first substrate 10 and the second substrate 60 and form a packaging strip, and the packaging layer 20 may generally be the frit including fine glass particles. The glass particles include one material or more materials of the following materials: magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), alumina ($Al_2O_3$), silicon dioxide ($SiO_2$), lead oxide (PbO), tin oxide (SnO), phosphorus oxide ($P_2O_5$), ruthenium oxide ($Ru_2O$), ruthenium oxide ($Rb_2O$), ruthenium oxide ($Rh_2O$), iron oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, borosilicate, etc.

In order to ensure reliability of sealing, the frit wraps around the first substrate 10 for a whole circle, and a position covered by the frit is generally referred to as a packaging region.

Moreover, by means of the metal extension layer mentioned above, (e.g., including via holes or a width of the metal extension layer being small), the packaging layer 20 is facilitated to be in contact with a dielectric layer under the metal extension layer, thereby packaging effect can be improved.

In summary, the packaging structure provided by the embodiment of the present application, includes: a first substrate, a first side of the first substrate including a power supply terminal; a second substrate; a metal extension layer extending from the power supply terminal to both ends of the first side of the first substrate; and a packaging layer disposed between the first substrate and the second substrate, covering the metal extension layer and fastening the first substrate and the second substrate. Thus through extended filling of metal materials, conducting of thermal energy and the breakage of the signal line can be improved.

Further, the uniformity of the thickness of the film may be improved by a design of the width of the metal extension layer being same to the width of the packaging layer.

Further, by via holes spaced in the metal extension layer, the stress can be effectively eliminated and the risk of the breakage of the signal line can be reduced.

Further, by disposed the metal extension layer in the middle of the packaging layer, a crack initiation point of the stress concentration can be eliminated and the risk of the breakage of the signal line can be reduced.

An OLED display device, including the packaging structure described above, is also provided in the embodiment of the present application.

Obviously, those skilled in the art may make various changes and modifications to the present application without departing from the spirit and scope of the present application. In this way, if the modifications and variations of the present application are within the scope of the claims of the present application and its equivalent technologies, the present application is also intended to include the modifications and variations.

What is claimed is:

1. A packaging structure, comprising:
a first substrate in a shape of polygon, a first side of the first substrate comprising a power supply terminal disposed at a first side of the polygon;
a second substrate;
a metal extension layer extending from the power supply terminal to both ends of the first side of the first substrate;
a packaging layer disposed between the first substrate and the second substrate, covering the metal extension layer, and fastening the first substrate and the second substrate;
a first metal layer disposed on a second side of the polygon, wherein the first metal layer comprises a plurality of via holes.

2. The packaging structure of claim 1, wherein the second substrate is a packaging cover.

3. The packaging structure of claim 1, wherein the metal extension layer comprises a plurality of via holes for stress relief.

4. The packaging structure of claim 3, wherein the via holes are spaced evenly.

5. The packaging structure of claim 3, wherein the power supply terminal compromises a plurality of via holes.

6. The packaging structure of claim 3, wherein each of the via holes is in a shape of square.

7. The packaging structure of claim 1, wherein a width of the metal extension layer is same to a width of the packaging layer.

8. The packaging structure of claim 1, wherein a width of the metal extension layer is ¼ to ⅓ of a width of the packaging layer.

9. The packaging structure of claim 8, wherein the metal extension layer is disposed in the middle of the packaging layer.

10. The packaging structure of claim 1, wherein the power supply terminal comprises a working voltage terminal and a common ground terminal.

11. The packaging structure of claim 10, wherein the metal extension layer comprises a first metal extension layer extending from the working voltage terminal to both ends of the side of the substrate and a second metal extension layer extending from the common ground terminal to both ends of the side of the substrate, and a portion of the first metal extension layer is not in contact with a portion of the second metal extension layer when the portion of the first metal extension layer and the portion of the second metal extension layer extend face to face respectively from the working voltage terminal and the common ground terminal.

12. The packaging structure of claim 1, wherein the packaging layer is disposed on the first metal layer.

13. The packaging structure of claim 1, wherein a shape of the metal extension layer is a polyline.

14. An OLED display device, comprising the packaging structure of claim 1.

* * * * *